INVENTOR
PIERRE BIZET
BY Paul M. Craig, Jr.
ATTORNEY

INVENTOR
PIERRE BIZET
BY Paul M. Craig, Jr.
ATTORNEY.

3,443,234

DRIFTLESS DIRECT CURRENT AMPLIFIER

Pierre Bizet, Fontenay-aux-Roses, France, assignor to CIT—Compagnie Industrielle des Telecommunications, Paris, France Filed Oct. 22, 1965, Ser. No. 501,704
Claims priority, application France, Oct. 26, 1964, 992,693
Int. Cl. H03f *15/00*
U.S. Cl. 330—6 11 Claims

ABSTRACT OF THE DISCLOSURE

Differential device supplying a direct output voltage with a first polarity for a first direction of an input current passing through a winding without galvanic contact with the output terminals and voltage of opposite polarity for the other direction of said input current, the said input current energizing an electromagnet which contains a small plate with Hall effect, this small plate being connected to the input of an amplifier in which a first frequency is generated for the first direction of the input current and a second frequency is generated for the opposite direction of the input current through control of the feedback from the output of the amplifier through the Hall effect small plate to the input of the amplifier.

The present invention relates in general to amplifiers and more particularly to a direct current amplifier which makes possible a transmission of electrical signals without drift currents of either polarity, ensures a thorough galvanic separation between the input and output terminals and the working and supply terminals of the amplifier, and is entirely electrical operating without any moving parts.

As is known, there exists a category of driftless D.C. amplifiers which utilize an electromagnetic modulator and provide for isolation of the grounds between the input and output terminals; however, this known equipment includes mechanical elements relating to the switching, modulation or other aspects of the device, which elements suffer from wear which eventually leads to malfunction of the equipment.

There also exists another category of D.C. amplifiers having an entirely electronic modulation system, but these devices do not provide isolation of the grounds between input and output terminals. In fact, none of the attempts to date to provide a driftless D.C. amplifier has been satisfactory with regard to all desirable characteristics.

The equipment in accordance with the invention avoids all of the above-mentioned difficulties by making use of the Hall effect, which occurs, as is known, in a small plate, preferably rectangular, of semi-conducting material, indium arsenide for instance. When placed in a non-oscillating magnetic field and when an electric voltage difference is applied at the midpoint of two opposite edges of the plate, there results an approximately proportional electromotive force between the midpoints of the two other edges, this E.M.F. having a given polarity when said magnetic field is in one direction and the reverse polarity when the magnetic field is in the other direction.

A D.C. amplifier according to the invention comprises an electromagnet including a ferro-magnetic core having an air gap, at least one field winding which is fed by the current to be amplified, and a Hall effect small plate located in the air gap provided with a first and second pair of terminals. Connected to the first pair of terminals is the input to an aperiodic amplifier, the output circuit of which comprises two transformers having, on the one hand, two series-connected primary windings, the first one being tuned by a shunt capacitor to a first frequency $f_1$ and the second one being tuned by a shunt capacitor to a second frequency $f_2$ and, on the other hand, series-connected secondary windings further connected to the above-mentioned second pair of terminals of the Hall effect small plate and, in addition, two tertiary windings.

The two tertiary windings of the above-mentioned transformers are connected, respectively, to two rectifying and filtering devices, one of which, being energized by a current at the frequency $f_1$ delivered by the first transformer, generates at its pair of output terminals a voltage which is positive as compared to a reference, the other one, being energized by a current at the frequency $f_2$ delivered by the second transformer, generating at its pair of output terminals a negative voltage, these two pairs of terminals being connected in parallel to a pair of load terminals.

It is an object of the present invention to provide a driftless D.C. amplifier which avoids the difficulties of prior devices of a similar nature by simple inexpensive means.

It is an object of the present invention to provide a driftless D.C. amplifier which is entirely electronic having no moving mechanical parts.

It is another object of the present invention to provide a driftless D.C. amplifier which provides for complete isolation of the grounds between input and output.

It is still another object of the present invention to provide a driftless D.C. amplifier having parameters such that the operation is stable and the D.C. current delivered at the load terminals follows closely the variations of the control current.

It is still another object of the present invention to provide a driftless D.C. amplifier having parameters which produce a ripple current in the output feed back to the control input.

These and other objects, features, and advantages of the invention will be better understood from the following specific description of the invention when taken in conjunction with the following drawings, wherein.

Figure 1:
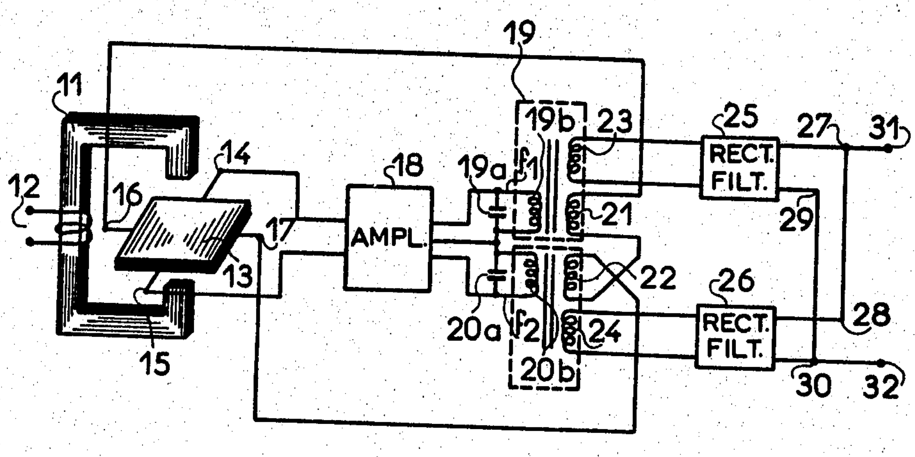
FIGURE 1 shows as a schematic diagram a first embodiment of the invention.

In FIGURE 1, the magnetic circuit 10 including a core 11, provided with an air gap, is energized by a field winding 12 through which flows the current $i_c$ to be amplified are transmitted. The gap of said magnetic circuit is occupied by a small rectangular plate 13 capable of producing the Hall effect. The center points of the opposite edges 14 and 15 of the plate 13 are connected to the input of an aperiodic amplifier 18. The output circuit of the amplifier 18 comprises a first transformer 19, the primary winding **19*b* of which is tuned by means of a shunt capacitor 19*a* to a first frequency $f_1$, and a second transformer 20, the primary winding 20*b* of which, series-connected to the winding 19*b*, is tuned by means of a shunt capacitor 20*a* to a second frequency $f_2$. The transformers 19 and 20 each include respective secondary windings 21, 22 connected in series to the second pair of terminals 16 and 17, of the above-mentioned Hall effect small plate 13**.

A tertiary winding 23 of the above-mentioned transformer 19 may supply a current at the frequency $f_1$ from the primary winding **19*b* to the input of a rectifying and filtering device 25, which delivers, at its output terminals 27 and 29 a voltage which is positive as compared to a reference whenever there exists a current at the frequency $f_1$ in the amplifier 18. A tertiary winding 24 of the above-mentioned transformer 20 may supply a current at the frequency $f_2$ from primary winding 20*b*** to the input of a rectifying and filtering device 26 which delivers at its output terminals 28 and 30 a negative voltage whenever there exists a current at the frequency $f_2$ in the amplifier 18. The output terminals 27 and 29 of the device 25 and the output terminals 28 and 30 of the device 26 are connected in parallel to two load terminals, one of which 31 is connected to the two terminals 27 and 28, while the other 32 is connected to the two terminals 29 and 30.

The arrangement of FIGURE 1 operates in accordance with the invention as follows:

For a given polarity of the magnetic field in the air gap when the gain of amplifier 18 is large enough to sustain oscillations with the proper feedback, there exists in the circuit made up by the small plate 13, the amplifier 18 and the transformer 19 a positive feedback to terminals 16 and 17 via secondary winding 21 which triggers oscillations in the amplifier at the frequency $f_1$. As a result, the rectifying-filtering device 25 is fed by a voltage at a frequency $f_1$ and a positive voltage appears of constant value between the terminals 31 and 32. At the same time, due to a polarity reversal in the $f_2$ frequency circuit, shown here as a reverse arrangement of the connections on the secondary winding 22 (but which could be obtained by other means without departing from the spirit and scope of the invention), a negative feedback will take place for any current induced in the winding 22. Generation of a voltage of frequency $f_2$ is therefore suppressed.

For the opposite polarity of the field in the air gap due to the polarity of the current $i_c$ and because of the reversal of the associated Hall effect polarity, the $f_2$ frequency is then triggered in amplifier 18 while the frequency $f_1$ is not triggered; as a result, the device 26 will then deliver a negative voltage to the load terminals 31, 32.

It should be understood that the amplifier 18 will generate a voltage in both primary windings 18*b* and 20*b*; however, these voltages will result in sustained oscillations at the given frequency only if a positive feedback is provided to sustain such oscillations. The polarity of the voltage applied to the input of the amplifier 18 from the terminals 14 and 15 of the plate 13 determines in each case whether the frequency $f_1$ or the frequency $f_2$ will be sustained. Thus, the direction of the field generated in the gap in the magnetic circuit is used to determine the polarity of the voltage at terminals 31 and 32.

It is also important to note that there is no coupling between the load terminals 31 and 32 and the input terminals of the winding 12, nor is there coupling with the power supply to the amplifier 18 in view of the transformers 19 and 20.

Figure 2:
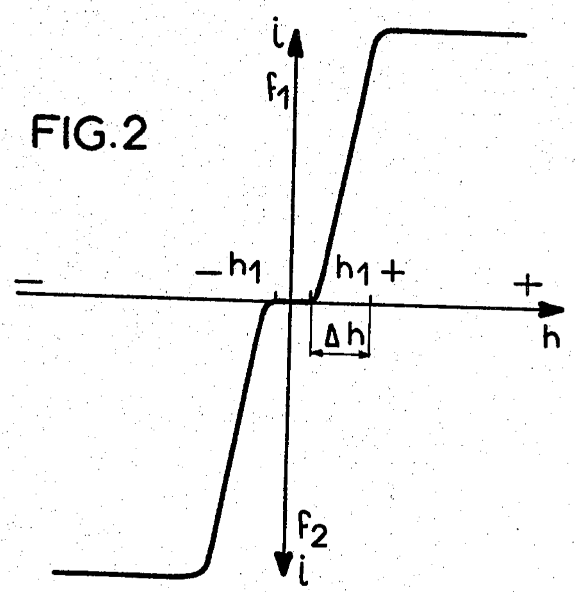
FIGURE 2 shows a diagram of the output characteristics of the device illustrated in FIGURE 1.

FIGURE 2 provides a schematic representation of the various operating conditions of the arrangement. For a value $|h|$ of the field in the air gap, where $|h|<|h_1|$, with $|h_1|$ being a threshold value of $|h|$, the Hall effect small plate 13 shows too small an attenuation for oscillations to be triggered in amplifier 18. When $|h|>|h_1|$ oscillations are triggered at either the frequency $f_1$ or at the frequency $f_2$, depending upon the polarity of the field $h$, i.e., depending on the direction of the current $i$ which is flowing in the winding 12, there results a current at the frequency $f_1$ for a certain value $|h_1+\Delta h|$ of the field, i.e., for a certain value $|i_1+\Delta i|$ of the control current, $i_1$ corresponding to the value of current capable of generating a field of $h_1$ of a certain value of a current at the frequency $f_2$ for a certain value $|h_1+h|$ of the field with reverse polarity. The $\Delta h$ value is small as compared to the possible values of $h$ and the amplifier is saturated relatively quickly and delivers a current at the frequency $f_1$ or $f_2$, which is nearly constant for a wide range of absolute values beyond $h_1$.

Consequently, for a low value $i_c$ of the control current lower than a certain threshold $i_o$, the voltage difference at the load terminals 31 and 32 is nil; when $i_c$ is positive, $(|i_c|>|i_o|)$, a voltage difference, for instance positive, occurs between the terminals 31 and 32 and rises quickly up to a saturation value I; when $i_c$ is negative $(|i_c|<|i_o|)$, the voltage difference between the terminals 31 and 32 is negative.

The terminals 31 and 32 may be connected to a network including transistors of complementary conduction, such as described in particular in U.S. patent application Ser. No. 496,613, filed on Oct. 15, 1965 in the name of Pierre Bizet, entitled "Electronic Switch." This prior application discloses a three-position transistor switch; namely, a switch having a neutral position for which no contact is made, a position making the contact in one direction, and a position making the contact in the other direction. The terminals 31 and 32 may be utilized in this prior disclosed arrangement and may also, within the scope of the invention, be connected to other devices such as blocking devices, etc.

Figure 3:
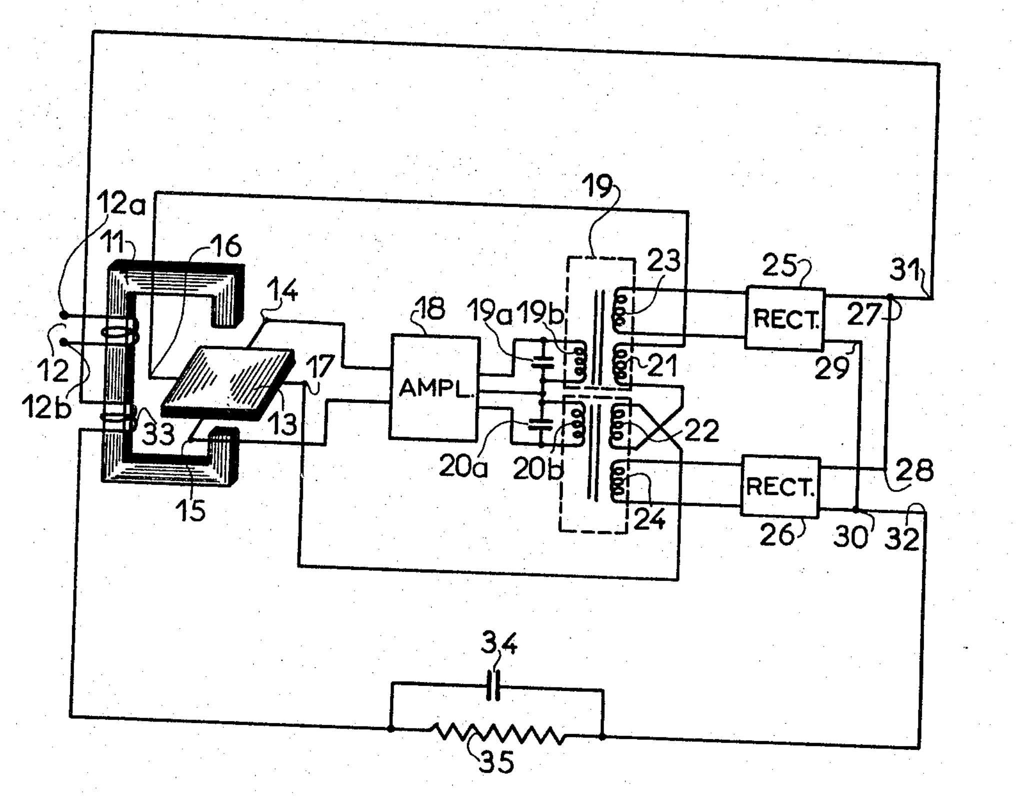
FIGURE 3 is a diagram of another embodiment of the invention.

FIGURE 3 shows another embodiment of the invention. In this figure, the same numerals designate the same parts as are shown in FIGURE 1. In addition, a load 35 is connected across the terminals 31 and 32 in series with a winding 33 provided on the magnetic core 11, the direction of the turns of which are such that the current flowing through it has a demagnetizing effect as compared to the magnetizing current $i_c$ which flows in the control winding 12.

This type of circuit arrangement is used preferably when it is desired that a direct current as close as possible to the control direct current $i_c$ be obtained in the load 35. In such a case, the characteristics of the winding 33 are identical to those of the winding 12. For appropriate values of the parameters, and in particular the gain of the amplifier 18 the negative feedback effect of the demagnetizing current makes it possible to achieve a stable condition wherein the current $i_c$ and the current $i'$ in the winding 12*b* may be made as small as desired.

According to another mode of operation of the arrangement of FIGURE 3, the circuit may be made unstable, either by increasing the gain of the amplifier 18, or by delaying, by means of conventional delay means (not shown), the application of the negative feedback current flowing through the winding 33. In such an arrangement the current flowing through this winding 33 appears as a current oscillating around an average value at a certain unstable frequency which depends upon the circuit parameters. The departure from the average value cannot be larger than $|I|$.

This mode of operation offers the advantage of reducing the influence of the hysteresis phenomena in the magnetic circuit 11. It corresponds to the current practice consisting of superimposing a high frequency field (for instance 100,000 c.p.s.) on a field recording of a magnetic tape. Filtering means, shown in FIGURE 3 as a capacitor 34, reduces the magnitude of the alternating component of the ripple current flowing through the load 35.

I claim:

1. A driftless D.C. amplifier comprising a magnetic circuit including a core having an air gap and at least one control winding fed by a control current, a small plate capable of exhibiting the Hall effect positioned within said gap and having a pair of input terminals and a pair of output terminals, an A.C. amplifier, the input of which is connected to said pair of output terminals of said Hall effect small plate, two transformers, the primary windings of which are wound in the same sense and are series-connected to the output of said amplifier, one of these primary windings being tuned to a first frequency $f_1$ and the other being tuned to a second frequency $f_2$, said transformers including two secondary windings series-connected to said pair of input terminals of the Hall effect small plate, said transformers each additionally including a tertiary winding, a first rectifying and filtering device connected to the tertiary winding of one transformer delivering at its output terminals an electromotive force which is positive as compared to a reference, a second rectifying and filtering device connected to the tertiary winding of the other transformer delivering at its output terminals a negative electromotive force, said secondary windings being wound in opposite senses so that for a first polarity of the magnetic field in said air gap, only the frequency $f_1$ provides positive feedback and is triggered in the arrangement to the exclusion of the frequency $f_2$ and that for the reverse polarity of the magnetic field only the frequency $f_2$ provides positive feedback and is triggered to the exclusion of the frequency $f_1$.

2. A driftless D.C. amplifier as defined in claim 1, wherein the output terminals of the first and second rectifying and filtering devices are connected in parallel to a pair of load terminals.

3. A driftless D.C. amplifier as claimed in claim 2, wherein said magnetic circuit comprises only one control winding, and a negative feedback winding wound around said magnetic core, said negative feedback winding being connected in series with a load to said load terminals.

4. A driftless D.C. amplifier as claimed in claim 3, wherein said amplifier is biased for high gain and stable operation so that the D.C. current delivered at the load terminals follows closely the variations of the control current due to the negative feedback.

5. A driftless D.C. amplifier as claimed in claim 3, wherein said amplifier is biased to produce oscillations which result in the superposition of a ripple current onto the D.C. current supplied by said load terminals, and including filtering means for preventing said ripple current from flowing through the load.

6. A driftless D.C. amplifier as defined in claim 1 wherein said first and second rectifying and filtering devices are connected with opposite polarity to said respective tertiary windings, one output of each of said devices being connected to a common terminal.

7. A driftless D.C. amplifier comprising:

a magnetic circuit including an air gap and means for generating a magnetic field of selectively variable direction in said air gap in response to a control signal, a Hall effect plate having a pair of input terminals and a pair of output terminals and positioned in said air gap, alternating current amplifier means including a first output circuit tuned to a first frequency and a second output circuit tuned to a second frequency, said output terminals of said Hall effect plate being connected to the input of said amplifier means, control means connecting the output of said first and second tuned output circuits to the input terminals of said Hall effect plate for providing positive feedback at said first frequency and thereby generate oscillations in said amplifier means at said first frequency for one direction of said magnetic field in said gap and providing positive feedback at said second frequency and thereby generate oscillations in said amplifier means at said second frequency for the opposite direction of said magnetic field in said gap.

8. A driftless D.C. amplifier as defined in claim 7 further including rectifying and filtering means, and output means coupled to said first and second output circuits via said rectifying and filtering means for providing a constant voltage output at selectively variable polarity.

9. A driftless D.C. amplifier as defined in claim 7 wherein said first and second tuned output circuits and said control means form respectively first and second tuned primary windings and first and second secondary windings of a transformer.

10. A driftless D.C. amplifier as defined in claim 7 wherein said first and secondary windings are connected in series to said input terminals of said Hall effect plate with said secondary winding reversed with respect to said first secondary windings.

11. A driftless D.C. amplifier as defined in claim 8 wherein said magnetic circuit further includes a magnetic core having a control winding and a negative feedback winding connected in series with said output means and a load.

References Cited

UNITED STATES PATENTS

| | | | |
|---|---|---|---|
| 3,189,838 | 6/1965 | Leger | 330—6 |
| 3,317,835 | 5/1967 | Dietz et al. | 330—6 X |

NATHAN KAUFMAN, *Primary Examiner.*

U.S. Cl. X.R.

330—3, 8, 9